United States Patent [19]

Wu et al.

[11] Patent Number: 5,065,450

[45] Date of Patent: Nov. 12, 1991

[54] FREQUENCY MODULATED RADIO FREQUENCY BROADCAST NETWORK EMPLOYING A SYNCHRONOUS FREQUENCY MODULATED BOOSTER SYSTEM

[75] Inventors: Joseph C. Wu, Saratoga; Charlie L. Hu, San Jose; Yee S. Law, Milpitas, all of Calif.

[73] Assignee: TFT, Inc., Santa Clara, Calif.

[21] Appl. No.: 586,502

[22] Filed: Sep. 21, 1990

Related U.S. Application Data

[63] Continuation-in-part of Ser. No. 326,744, Mar. 21, 1989.

[51] Int. Cl.$^5$ .................... H04B 1/40; H04B 7/165
[52] U.S. Cl. ........................ 455/20; 455/23; 455/51; 455/75; 455/260; 455/265
[58] Field of Search ............ 455/23, 22, 42, 151, 455/110, 112, 113, 118, 119, 126, 208, 209, 258-260, 265, 13, 14, 16, 20, 75; 331/18, 22, 23, 31

[56] References Cited

U.S. PATENT DOCUMENTS

| | | | |
|---|---|---|---|
| 2,284,415 | 5/1942 | Goldstine | 250/15 |
| 2,545,197 | 3/1951 | Darling | 250/6 |
| 3,912,019 | 8/1975 | Bruene | 179/15 BT |
| 3,927,373 | 12/1975 | Janssens | 325/58 |
| 4,117,405 | 9/1978 | Martinez | 325/58 |
| 4,188,582 | 2/1980 | Cannalte et al. | 325/58 |
| 4,208,630 | 6/1980 | Martinez | 375/7 |
| 4,322,842 | 3/1982 | Martinez | 370/11 |
| 4,395,776 | 7/1983 | Naito et al. | 455/119 |
| 4,451,930 | 5/1984 | Chapman et al. | 466/260 |
| 4,506,383 | 3/1985 | McGann | 455/17 |
| 4,513,415 | 4/1985 | Martinez | 370/92 |
| 4,626,914 | 12/1986 | Breimer | 358/148 |
| 4,696,052 | 9/1987 | Breeden | 455/51 |
| 4,709,401 | 11/1987 | Akerberg | 455/51 |
| 4,710,970 | 12/1987 | Wu et al. | 455/113 |
| 4,837,853 | 6/1989 | Heck | 455/208 |

FOREIGN PATENT DOCUMENTS

2061518B 5/1983 United Kingdom.

OTHER PUBLICATIONS

Advertising Literature published by Continental Electronics Mfg. Co. entitled "Continental Type 802A FM Exciter", 1984.
Advertising Literature published by Broadcast Electronics Inc. entitled "FX-30 Synthesized FM Exciter".
Advertising Literature published by Television Technology Corporation entitled "Solid State FM Transmitter FM-300J".
Article published by Omega International entitled "Synchronous Repeaters".

Primary Examiner—Curtis Kuntz
Assistant Examiner—Chi H. Pham
Attorney, Agent, or Firm—Jack M. Wiseman

[57] ABSTRACT

A frequency modulated radio frequency broadcast network in which re-transmitting stations employ a synchronous frequency modulated booster system. Included in the frequency modulated booster system is a synchronous frequency modulated exciter for converting a frequency modulated intermediate frequency into a frequency modulated broadcast signal. The synchronous frequency modulated exciter includes phase locked loop circuits for synchronizing the re-transmitted frequency modulated broadcast signal with the frequency modulated intermediate frequency signal by detecting reference signals in the composite baseband of the intermediate frequency signal and in the composite signal frequency modulated broadcast signal.

12 Claims, 5 Drawing Sheets

FREQUENCY MODULATED RADIO FREQUENCY BROADCAST NETWORK EMPLOYING A SYNCHRONOUS FREQUENCY MODULATED BOOSTER SYSTEM

RELATED CASE

This application is a continuation-in-part of our pending application, Ser. No. 07/326,744, filed on Mar. 21, 1989, for Frequency Modulated Radio Frequency Broadcast Network Employing A Synchronous Frequency Modulated Booster System.

BACKGROUND OF THE INVENTION

The present invention relates in general to a frequency modulated radio frequency synchronous repeater system for the transmission of frequency modulated broadcast signals, and more particularly to a frequency modulated radio frequency repeater system employing a synchronous frequency modulated booster system for the re-transmission of frequency modulated broadcast signals.

Frequency modulated broadcast transmissions have been limited to audiences within a reception area. In order to increase the reception area for the frequency modulated broadcast transmission to reach a greater audience, re-transmission sites have been installed in areas remotely located from the originating transmitter. At the re-transmission sites were booster transmitters and synchronous transmitter exciters to increase the power level of the frequency modulated broadcast signals at a re-transmission site.

Heretofore, a demodulation process was used at a re-transmission site which caused frequency discrepancies, phase shifts, delays and inconsistent modulation levels between the originating frequency modulated broadcast signal and the frequency modulated broadcast signal at the re-transmission site. Phase shifts, frequency discrepancies, delays and inconsistent modulation levels between the originating frequency modulated radio frequency signal and the re-transmitted frequency modulated radio frequency signal resulted in signal degradation and noise interference in the coverage area intended for improvement by the re-transmitted frequency modulated broadcast signal of the booster transmitter.

Heretofore, a device was employed to produce a reference signal for synchronizing and stabilizing the output of frequency modulated radio frequency signals transmitted at a re-transmission booster site. The device did not use a reference signal generated at the site of the originating transmitter or re-use the FM modulation in the original carrier. Hence, the output of the frequency modulated radio frequency signal of the transmitter at the re-transmission booster site was modified from the original FM signal in frequency and in phase.

In the U.S. Pat. No. to Wu et al., 4,710,970, issued on Dec. 1, 1987, for Method Of And Apparatus For Generating A Frequency Modulated Ultrahigh Frequency Radio Transmission Signal, there is disclosed an ultra high radio frequency transmitter. The output of a very high frequency voltage controlled generator is phase locked through a phase detector with a voltage controlled crystal oscillator producing a reference signal for the stabilizing of the output transmission frequency of the ultra high radio frequency transmission frequency oscillator.

In the U.S. Pat. No. to Martinez, 4,208,630, issued on June 17, 1980, for Narrow Band Paging Or Control Radio System, there is disclosed a radio system for paging in which a central transmitting device and remote receiving devices are phase locked to a local broadcast station radio frequency carrier so as to provide a means to synchronize the transmitting device with the receiving device.

The British Patent to McGraw-Edison Company, No. 2,061,581B, published on May 18, 1983, for Communication System For Distribution Automation And Remote Metering, discloses a phase detector to which is applied the output of a limiter-amplifier and a reference signal from a voltage controlled crystal oscillator. The output of the phase detector is a control signal which is proportional to the phase differences of the input signals to the phase detector. The error signal is applied to the voltage controlled crystal oscillator. The circuit described is part of a phase locked loop circuit.

In an article published by Omega International of Irvine, Calif., entitled Synchronous Repeaters, there is mentioned that the output frequency of a booster is phase locked with the originating station through analog simulation of a digital control signal derived from the originating station.

Heretofore, FM exciters were sold to accept the composite baseband signal from a stero generator, and STL system or monaural audio and SCA programming, and to generate its operating frequency with a digitally programmed, phase-locked frequency synthesis system. Such an FM exciter was sold by Continental Electronics Mfg. Co. of Dallas, Tex., as the Continental Type 802A FM exciter, and by Broadcast Electronics of Quincy, Ill., as the Model FX-30.

SUMMARY OF THE INVENTION

A synchronous frequency modulated booster system for a transmitter that re-transmits frequency modulated radio frequency signals at a booster site away from the originating program source. The synchronous frequency modulated booster system includes a synchronous FM transmitter exciter that converts incoming frequency modulated intermediate frequency signals transmitted at the site of an originating transmitter to the frequency modulated radio frequency signals transmitted by the originating transmitter and applies the frequency converted frequency modulated radio frequency modulated radio frequency signals to a booster transmitter that re-transmits the frequency modulated radio frequency signals.

A synchronous frequency modulated booster system comprises a transmitter that re-transmits frequency modulated radio frequency signals. The synchronous frequency modulated booster system includes a synchronous FM exciter that receives an IF signal and a reference pilot signal generated at the originating transmitter for synchronizing the carrier frequency and modulation level of frequency modulated radio frequency signals applied to the transmitter for re-transmission with the frequency modulated radio frequency signals transmitted at the originating transmitter.

An object of the present invention is to provide a method of synchronizing frequency modulated booster system for a transmitter that re-transmits frequency modulated radio frequency signals, which booster system includes a synchronous FM exciter for stabilizing the frequency of the booster transmitter and the baseband, and to obviate group delays, and inconsistent modulation levels between frequency modulated radio frequency signals transmitted by an originating transmitter and the frequency modulated radio frequency signals re-transmitted from a remote transmitter.

Another object of the present invention is to provide a synchronous frequency modulated booster system for a transmitter that re-transmits frequency modulated radio frequency signals which booster system includes a synchronous FM exciter for receiving a reference signal from the site of the originating transmitter along with frequency modulated intermediate frequency signals for synchronizing the re-transmitted frequency modulated radio frequency signals with the frequency modulated radio frequency signals transmitted by the originating transmitter to preserve signal integrity and stability.

Another object of the present invention is to provide an economical arrangement for intermediate frequency repeating transmitter links.

A feature of the present invention is to obviate need for an additional subcarrier frequency which has been heretofore used for transmitting a synchronizing tone to lock the carrier frequency of the FM transmitter.

Another feature of the present invention is that the modulation levels at all remote transmitters are synchronized.

Another feature of the present invention is the minimization of audio phase delays for enhancing stereo quality.

Another feature of the present invention is the elimination of an FM subcarrier to transmit a reference signal for synchronizing the frequency of the booster transmitter.

An object of the present invention is to provide a frequency modulated radio frequency broadcast network having an originating frequency modulated radio frequency transmitter and a re-transmitting frequency modulated radio frequency transmitter with a booster that reduces phase noise in the re-transmitted frequency modulated broadcast carrier to improve the signal quality in the overlap carrier areas of the originating frequency modulated radio frequency transmitter and the re-transmitting frequency modulated radio frequency transmitter.

A feature of the present invention is a cleaner spectrum in the re-transmitted broadcast frequency modulated carrier by the direct generation of the re-transmitted broadcast frequency modulated carrier from a voltage controlled oscillator in the FM exciter of the re-transmitting frequency modulated radio frequency transmitter.

Another feature of the present invention is the achievement of improved audio quality resulting from the elimination of the demodulation and reproduction process, which normally occurs in an STL-Exciter program transmission system.

DESCRIPTION OF THE PREFERRED EMBODIMENTS

Figure 1:
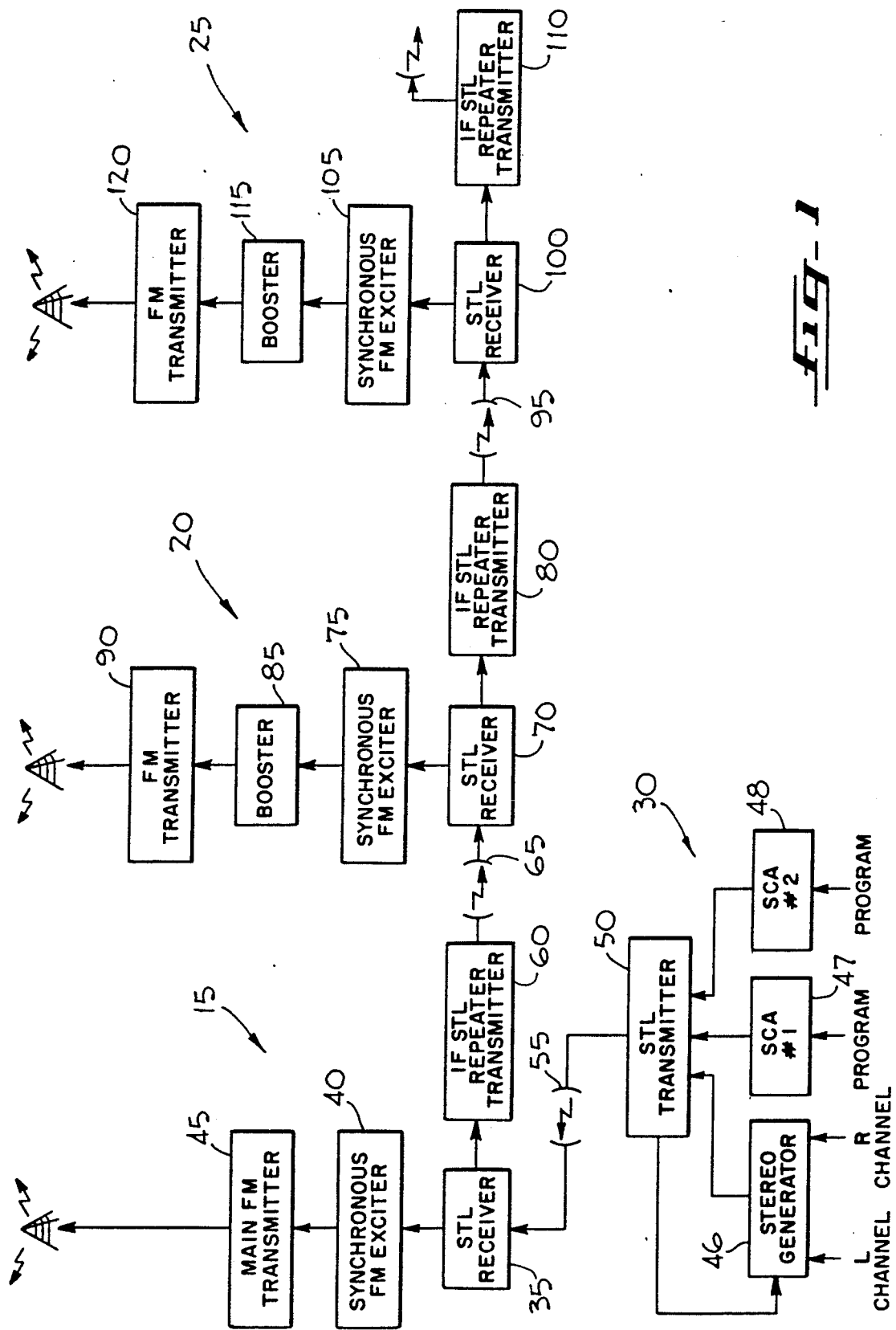
FIG. 1 is a block diagram of a transmitter system for originating frequency modulated radio frequency signals and transmitter systems for re-transmitting frequency modulated radio frequency signals.

Illustrated in FIG. 1 is a serial feed frequency modulated radio frequency broadcast system or network 10 with boosters, which comprises an originating broadcast station 15 for broadcasting an originating frequency modulated radio frequency signal (FM) and re-transmitting broadcast stations 20 and 25 for re-transmitting, respectively, the frequency modulated radio frequency signals (FM) transmitted by the originating broadcast station 15. The re-transmitting broadcast stations 20 and 25 are on-site remotely located from the site of the originating broadcast station 15.

The originating FM broadcast station 15 comprises a suitable studio 30, a conventional studio transmitter link (STL) receiver 35 with an intermediate frequency output, a synchronous FM exciter 40, and a conventional originating FM transmitter 45. Included in the studio 30 are an FM broadcast stereo generator 46, and conventional FM subcarrier generators for subsidiary communication authorization (SCA) equipment 47 and 48, all of which are connected to a conventional studio link (STL) transmitter 50 for transmitting a composite FM baseband signal from the studio to the originating broadcast station 15.

The FM broadcast stereo generator 46 is modified to accept a highly stable time base reference signal. This signal is 19 KHz or multiple of 19 KHz generated by a highly stable crystal oscillator, not shown, with a long term stability of 1 ppm per year. The highly stable crystal oscillator is included in the STL transmitter 50. In this manner, a highly stable time base reference signal is provided for phase locking the originating broadcast frequency and the rebroadcasting frequencies in the entire network 10 so that stability and accuracy of the broadcast frequencies are achieved.

The output of the STL transmitter 50 is an FM signal which, in the exemplary embodiment, is a 950 megahertz (MHz) signal. The frequency deviation (modulation level) of the STL transmitter is 50% ±37.5 MHz of the FM broadcast carrier, which, in the exemplary embodiment, is 88 MHz-108 MHz. The stereo generator 46 and the SCA equipment 47 and 48 modulate the carrier frequency generated by the STL transmitter 50 with the program to be broadcast to provide the FM signal of 950 MHz. The STL transmitter 50 applies a reference signal to the stereo generator 46. In the exemplary embodiment, the reference signal is a 19 kilohertz (KHz) signal or a multiple of a 19 KHz frequency signal.

The STL receiver 35 receives through a suitable studio link 55, the FM signal from the STL transmitter 50, and applies an FM signal to the synchronous FM exciter 40 and an FM signal to a conventional intermediate frequency (IF) STL transmitter or a one-way repeater 60. In the exemplary embodiment, the FM signal applied to the synchronous FM exciter 40 from the STL receiver 35 is a 2.5 MHz signal and the FM signal applied to the IF repeater STL transmitter 60 is a 63 MHz signal, which is also the IF signal of the STL receiver 35. The studio link 55, in the exemplary embodiment, may be a conventional microwave link, telephone lines, or the like. The reference signal from the stereo generator 46 to the STL transmitter 50 is received by the STL receiver 35 with the 950 MHz signal and is present in both the 2.5 MHz signal applied to the synchronous FM exciter 40 and the 63 MHz signal applied to the IF STL transmitter 60.

The synchronous FM exciter 40, which will be described in detail hereinafter, applies to the originating FM transmitter 45, an FM broadcast signal, the carrier frequency of which is generated by the synchronous FM exciter 40. In the exemplary embodiment, the FM transmitter 45 transmits an FM broadcast signal in the range of 88 MHz-108 MHz.

A conventional link 65, such as a microwave link, VHF or UHF link, inter-city relay and the like is employed for transmitting an FM IF signal to an STL receiver 70 of the re-transmitting FM broadcast booster station 20. In the exemplary embodiment, the FM IF signal transmitted by the IF STL transmitter 60 is an FM 950 MHz signal. The IF STL transmitter 60 increases the carrier frequency from 63 MHz to 950 MHz, in the exemplary embodiment.

The STL receiver 70 applies an FM IF signal to a synchronous FM exciter 75 of the re-transmitting station 20 and an FM IF signal to an IF repeater STL transmitter or one-way repeater 80 of the re-transmitting station 20. The signal applied to the synchronous FM exciter 75, in the exemplary embodiment, is 2.5 MHz FM signal with a 19 KHz reference signal in the composite baseband signals. The signal applied to the IF repeater STL transmitter 80, in the preferred embodiment, is 63 MHz FM signal with a 19 KHz reference signal in the composite baseband signals which is also the IF signal of the STL receiver 70. The synchronous FM exciter 75, which will be described in detail hereinafter, is similar in construction and operation to the synchronous FM exciter 40 of the originating transmission station 15. In the exemplary embodiment, the output of the synchronous FM exciter 75 is an FM signal having a frequency in the range of 88 MHz-108 MHz.

Connected to the output of the synchronous FM exciter 75 is a suitable booster 85 of the re-transmission station 20, which, in a conventional manner, amplifies the power of the FM signal applied to a re-transmitting or repeater transmitter 90 of the re-transmitting station 20. Thus, the output of the FM signal from the synchronous FM exciter 75 has the power level thereof amplified by the booster 85 to compensate for losses that may occur from the transmission of signals from the broadcast station 15 to the broadcast station 20 and increase the signal strength of the originating transmitter 15 without causing transmission interference with other booster stations of the network 10. The output signal of the re-transmitter 90, in the preferred embodiment, is in the range of 88 MHz-108 MHz.

A conventional link 95, such as a microwave link, VHF or UHF link, inter-city relay and the like is employed for transmitting an FM IF signal to an STL receiver 100 of the re-transmitting FM broadcast booster station 25. In the exemplary embodiment, the FM IF signal transmitted by the IF repeater STL transmitter 80 is an FM 950 MHz signal. The IF repeater STL transmitter 80 increases the carrier frequency from 63 MHz to 960 MHz in the exemplary embodiment.

The STL receiver 100 applies an FM signal to a synchronous FM exciter 105 of the re-transmitting station 25 and an FM signal to an IF repeater STL transmitter or one-way repeater 110 of a succeeding station. The signal applied to the synchronous FM exciter 105, in the exemplary embodiment, is a 2.5 MHz FM signal with a 19 KHz reference signal in the composite baseband frequencies. The signal applied to the IF repeater STL transmitter 110, in the preferred embodiment, is a 63 MHz FM signal with a 19 KHz reference signal in the composite baseband signals which is also the IF signal of the STL receiver 100. The synchronous FM exciter 105, which will be described in detail hereinafter, is similar in construction and operation to the synchronous FM exciter 75 of the re-transmission station 20. In the exemplary embodiment, the output of the synchronous FM exciter 105 is an FM signal having a frequency in the range of 88 MHz-108 MHz.

Connected to the output of the synchronous FM exciter 105 is a suitable booster 115 of the re-transmission station 20, which, in a conventional manner, amplifies the power of the FM signal applied to a re-transmitting or repeater transmitter 120 of the re-transmitting station 25. Thus, the output of the FM signal from the synchronous FM exciter 105 has the power level thereof amplified by the booster 115 to compensate for losses that may occur from the transmission of signals from the originating broadcast station 15 to the re-broadcast station 25 and, perhaps, increase the signal strength of the originating transmitter 15 without causing transmission interference with other booster stations of the network 10. The output signal of the re-transmitter 120, in the preferred embodiment, is in the range of 88 MHz-108 MHz.

In the FM broadcast network 10, the studio STL transmitter 50 is in communication with the originating broadcast station 15, but is isolated from the FM re-broadcast stations 20 and 25 or and succeeding re-broadcast station of the network 10. The FM signal is transmitted successively from one transmitter to the succeeding transmitter in a serial fashion starting with the originating transmitter 45 and proceeding successively or in series in the order of proximity to the originating transmitter 45.

Figure 2:
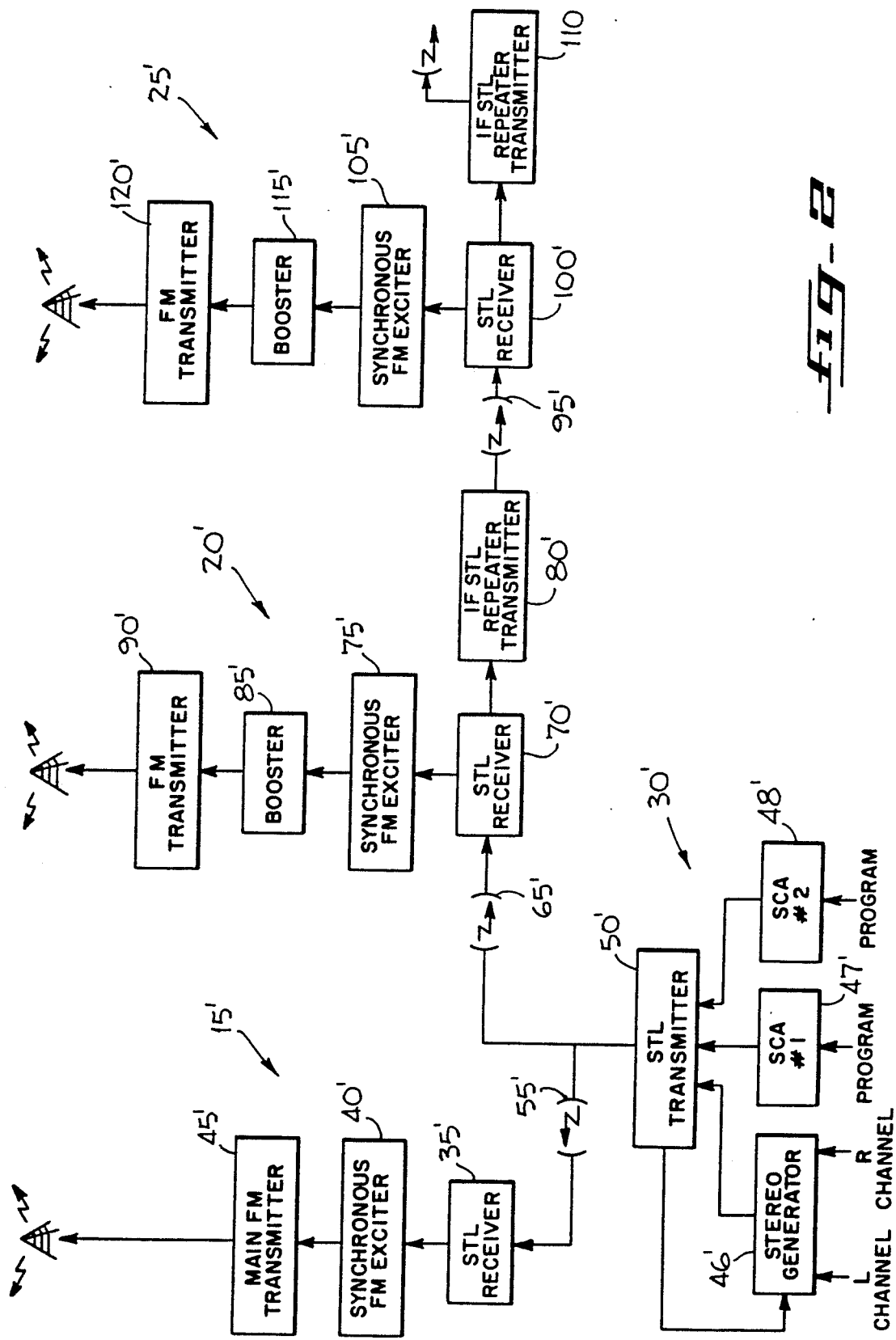
FIG. 2 is a block diagram of a modification of the transmitter system shown in FIG. 1.

Illustrated in FIG. 2 is a parallel feed frequency modulated radio frequency broadcast system or network 125 with boosters, which is a modification of the FM radio frequency broadcast system or network 10 shown in FIG. 1. Elements of the FM radio frequency system 125 similar in construction and operation to the elements of the FM radio frequency system or network 10 are designated with the same reference numeral but with a prime suffix.

The FM radio frequency broadcast system 125 differs from the FM radio frequency broadcast system 10 in that the IF repeater STL transmitter 60 has been omitted. As a consequence thereof, the STL transmitter 50' has the output thereof transmit the baseband composite signals directly to the STL receiver 70' of the re-transmitting broadcast station 20'. Thus, the originating transmitter 45' is boosted by the re-transmitting stations 20', 25' and any succeeding re-transmission station. In this arrangement, the STL transmitter 50' of the studio 30' of the originating broadcast station 10' applies an FM signal to the STL receiver 35' of the originating broadcast station 10' and to the succeeding STL receiver 70' of the re-transmitting broadcast station 20'. Thus, the STL transmitter 50' applies an FM signal to the originating transmitter station 15' and the succeeding re-transmitter and repeater station 20'. The re-transmitting station 25' operates in the manner heretofore described in connection with the re-transmitting station 25 in FIG. 1 and its reception in relation to re-broadcast station 20' is similar to that heretofore described in relation to re-broadcast station 25 and re-broadcast station 20 of FIG. 1.

Figure 3:
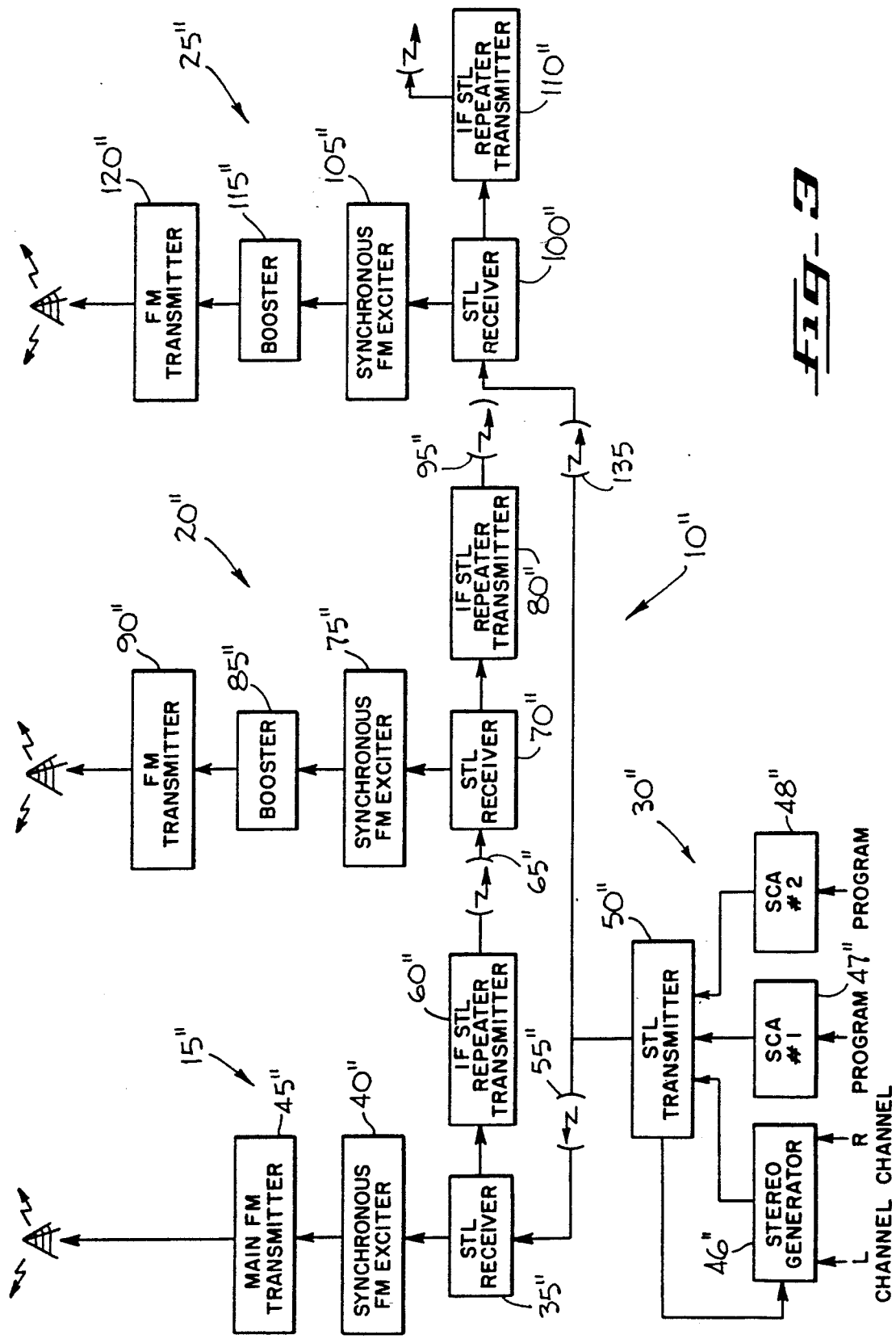
FIG. 3 is a block diagram of a further modification of the transmitter system shown in FIG. 1.

Illustrated in FIG. 3 is a parallel and serial feed FM radio frequency broadcast system or network 130 with boosters, which is a further modification of the FM radio frequency broadcast system 10 shown in FIG. 1. Elements of the FM radio frequency system 130 or network similar in construction and operation to the elements of the radio frequency system 10 are designated with the same reference numeral but with a double prime suffix.

The FM radio frequency broadcast system 130 differs from the FM radio broadcast system 10 in that the STL transmitter 50'' of the studio 30'' for the originating broadcast station 15'' has the output thereof additionally transmit the baseband composite signals to the STL receiver 100'' of the re-transmitting station 25'' through a suitable link 135. Thus, the input of the IF repeating STL receiver 100'' of the re-transmitting station 25'' does not receive the output of the IF repeater STL receiver 70'' of the re-transmitting station 20' but receives the output of the STL transmitter 50'' of the studio 30'' of the originating broadcast station 15'' through the link 135. The link 135 may be a microwave link, VHF or UHF link, inter-city relays or the like.

The FM broadcast system 130 shown in FIG. 3 is employed when the terrain isolates the FM re-transmitting system 25'' from the FM re-transmitting system 20''. In this arrangement, the STL transmitter 50'' in the studio 30'' sends an FM signal to the originating broadcast station 15'' and to the nearest unobstructed re-transmitting broadcast station 20'' and the originating broadcast station 15''. The FM signal is then relayed to the obstructed re-transmitting broadcast station 25'' from the STL transmitter 50'' at the originating broadcast station 15''.

Figure 4:
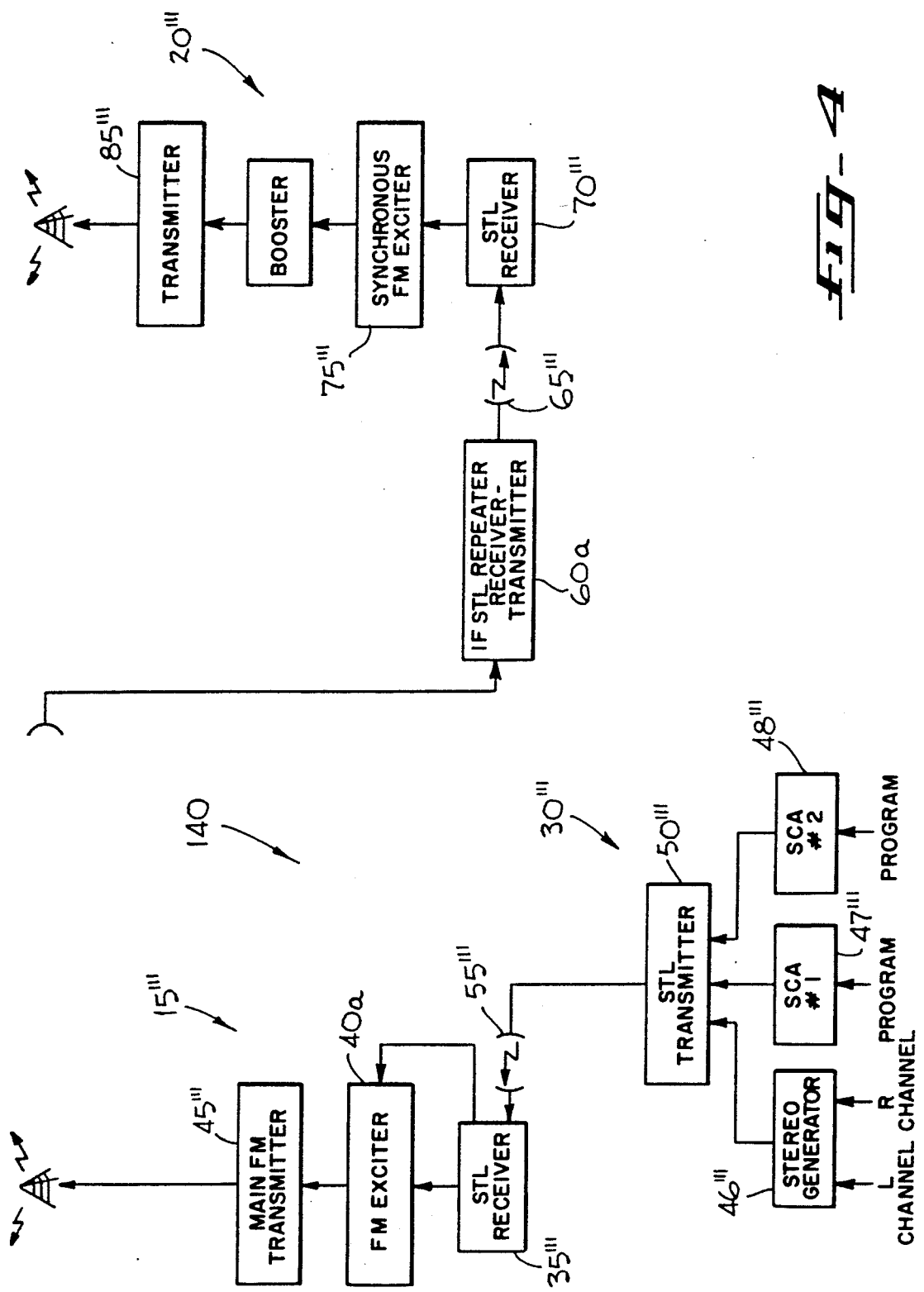
FIG. 4 is a block diagram of a still further modification of the transmitter system shown in FIG. 1.

Illustrated in FIG. 4 is an FM radio frequency broadcast system or network 140 with boosters, which is a still further modification of the FM radio frequency broadcast system or network 10. Elements of the FM radio frequency system or network 140 similar in construction and operation to the elements of the radio frequency system or network 10 are designated with the same reference numeral but with a triple prime suffix.

The FM radio frequency broadcast system or network 140 differs from the FM radio frequency broadcast system or network 10 in that the reference time base signal from the STL receiver 35''' is applied over a separate path to an FM modulating exciter 40a. An IF repeater STL receivertransmitter 60a is located at a relay point between the originating transmitter station 15''' and the booster station 20'''. In the exemplary embodiment, the FM signal received by the IF repeater STL receiver-transmitter 60a from the originating transmitters 45''' is in the range of 88 MHz-108 MHz. Similarly, the IF signal from the STL receiver 70''' is applied to the synchronous FM exciter 75'''. The FM exciter 40a is a modification of a conventional FM broadcast exciter and is arranged to accept an external time base reference signal for phase locking the broadcast frequency carrier in the range of 88 -108 MHz. The external time base reference signal is in the frequency range of 2.5 KHz to 19 KHz and is generated from a conventional stable crystal oscillator, not shown, having a long term stability of a ppm per year. The time base reference signal for locking the FM broadcast exciter 40a is generated in the STL receiver 35'''.

Figure 5:
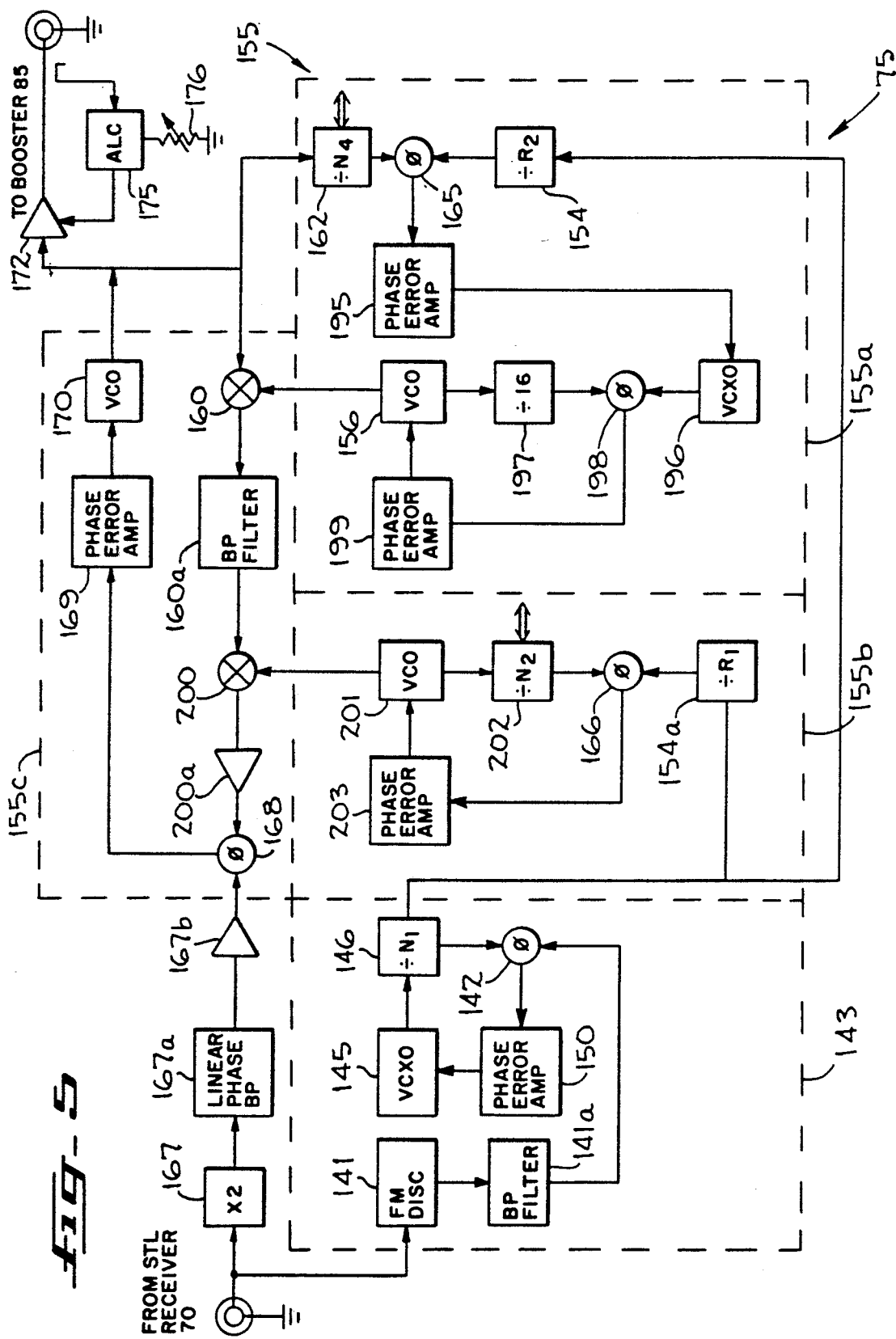
FIG. 5 is a schematic diagram of a synchronous FM exciter employed in the transmitter system shown in FIGS. 1-4.

Illustrated in FIG. 5 is the synchronous FM exciter 75 shown in block diagram in FIG. 1. The synchronous FM exciters 40 and 105 are similar in construction and operation to the synchronous FM exciter 75 and, hence, only the synchronous FM exciter 75 will be described in detail. It follows that the synchronous FM exciters 40', 75', 105', 40'', 75'', 105'', and 75''' are similar in construction and operation to the synchronous FM exciter 75.

The synchronous FM exciter 75 has applied thereto from the STL receiver 70 an FM IF signal, which, in the exemplary embodiment, is a 2.5 MHz FM IF signal modulated by the composite signals for the FM broadcasting including a reference signal of 19 KHz, in the exemplary embodiment. The peak frequency deviation of the 2.5 MHz signal is ±37.5 KHz. The 2.5 MHz FM IF signal is applied to a conventional FM discriminator 141, which demodulates the 2.5 MHz signal into the reference signal of 19 KHz. The 19 KHz reference signal is applied to one input of a conventional phase detector 142 of a phase locked loop circuit 143 through a suitable bandpass filter 141a. The FM discriminator 141 and the bandpass filter 141a is part of the phase locked loop circuit 143.

A suitable reference signal is generated by a conventional voltage controlled crystal oscillator (VCXO) 145 of the phase locked loop circuit 143. The output of the VCXO 145 is applied to a conventional frequency divider circuit 146 of the phase locked loop circuit 143. The output frequency of the VCXO 145, in the exemplary embodiment, is 15.2 MHz. The output frequency of the frequency divider network 146 which is, in the exemplary embodiment, a 19 KHz reference signal, is applied to the other input of the phase detector 142.

The phase detector 142 produces in the output thereof an error signal whose amplitude is proportional to the difference in phase between the input signals applied to the phase detector 142. The phase error signal is applied to a conventional phase error amplifier 150 of the phase locked loop circuit 143. The phase error signal produced in the output of phase error amplifier 150 is applied to the VCXO 145 to compensate for the phase error or difference applied to the inputs of the phase detector 142.

When the phase difference of the reference signals applied to the inputs of the phase detector 142 approaches or approximates zero, the VCXO 145 is phase locked to the 19 KHz reference signal contained in the composite signal in the output of the FM discriminator 141. The stable reference signal in the output of the VCXO 145 is now phase locked with the 19 Khz reference signal of the composite signal in the output of the FM discriminator 141 and the IF frequency modulated signal sent by the originating broadcast station 15.

Another output of the frequency divider circuit 146 is applied to conventional frequency divider networks 154 and 154a of phase locked loop circuits 155a and 155b, respectively. In the exemplary embodiment, the output frequency of the VCXO 145 applied to the divider circuit 146 is 15.2 MHz. The reference signal in the output of the frequency divider circuit 146, in the exemplary embodiment, is 80 KHz. The reference signal in the output of the respective frequency divider networks 154 and 154a, in the exemplary embodiment, is 10 KHz. The 10 KHz reference signals of the divider networks 154 and 154a are applied respectively to one input of a conventional phase detector 165 of the phase locked loop circuit 155a and to one input of a conventional phase detector 166 of the phase locked loop circuit 155b.

The FM IF signal from the STL receiver 70 is applied to a conventional frequency doubler circuit 167. Thus, the output of the frequency doubler circuit 167, in the exemplary embodiment, is 5 MHz. The frequency doubler circuit 167 multiplies the peak frequency deviation of the STL modulation to ±75 KHz. The output of the frequency doubler circuit 167 is applied to one input of a conventional phase detector circuit 168 of the phase locked loop circuit 155c through a suitable linear phase bandpass filter 167a and a suitable amplifier 167b.

The phase error signal of the output of the phase detector 168 is applied to a conventional phase error amplifier 169 of the phase locked loop circuit 155c. The phase detector 168 produce's in its output an error signal whose amplitude is proportional to the difference in phase between the input signals applied to the phase detector 168. The phase error signal is applied to the phase error amplifier 169. The phase error signal produced in the output of the phase error amplifier 169 is applied to a conventional voltage controlled oscillator (VCO) 170 of the phase locked loop circuit 155c to compensate for the phase error or difference applied to the inputs of the phase detector circuit 168.

When the phase differences of the reference and comparison signals applied to the inputs of the phase detector 168 approaches or approximates zero, the VCO 170 is phase locked to the 5 MHz reference signal in the output of the frequency doubler circuit 167. The VCO 170 generates the FM broadcast carrier, which, in the exemplary embodiment, is between 88 MHz and 108 MHz. Thus, the phase locked loop circuit 155c is the phase locked loop circuit that phase locks the VCO 170 to the reference signal derived from the FM IF signal emanating from the STL receiver 70, which, in the exemplary embodiment, is 2.5 MHz.

One output of the VCO 170 is applied to a conventional frequency divider circuit 162 of the phase locked loop circuit 155a. The frequency divider circuit 162 is a programmable divider circuit and produces in its output a 10 KHz signal, in the exemplary embodiment, which is applied to one input of a conventional phase detector circuit 165 of the phase locked loop circuit 155a. Applied to the other input of the phase detector circuit 165 is the output frequency of the frequency divider circuit 154, which in the exemplary embodiment is 10 KHz. The output signal of the frequency divider circuit 154 applied to the phase detector circuit 165 is derived from the stable output reference signal derived from the VCXO 145 of the phase locked loop circuit 143.

The phase detector circuit 165 produces in its output an error signal whose amplitude is proportional to the difference in phase between the input signals applied to the phase detector 165. The phase error signal is applied to a conventional phase error amplifier 195 of the phase locked loop circuit 155a. The phase error signal produced in the output of the phase error amplifier 195 is applied to a conventional voltage controlled crystal oscillator (VXCO) 196 of the locked loop circuit 155a.

When the phase differences of the reference and comparison signals applied to the inputs of the phase detector circuit 165 approaches or approximates zero, the stable reference signal in the output of the VCXO 196 is now phase locked with the stable reference output signal of the VCXO 145 through the frequency divider circuits 146 and 154. The output of the VCXO 196 is applied to one input of a conventional phase detector circuit 198 of the phase locked loop circuit 155a.

In the exemplary embodiment, the output signal produced by a voltage controlled oscillator (VCO) 156 of the phase locked loop circuit 155a is in the range of 144 MHZ-168 MHz. One output signal of the VCO 156 is applied to a conventional frequency divider circuit 197 of the phase locked loop circuit 155a. In the exemplary embodiment, the divider circuit 197 is a ÷16 divider. The output of the frequency divider circuit 197 is applied to one input of a conventional phase detector circuit 198 of the phase locked loop circuit 155a. The output of the VCXO 196 is applied to the other input of the phase detector circuit 198. The output of the phase detector circuit 198 is applied to a conventional phase error amplifier 199 of the phase locked loop circuit 155a.

The phase detector circuit 198 produces in the output thereof an error signal whose amplitude is proportional to the differences in phase between the input signals applied to the phase detector 198. The phase error signal in the output of the phase detector circuit 198 is applied to the phase error amplifier 199. The phase error signal produced in the output of the phase error amplifier 199 is applied to the VCO 156 to compensate for the phase error or phase difference applied to the phase detector circuit 198.

When the phase difference of the input signals applied to the inputs of the phase detector 198 approaches or approximates zero, the VCO 156 is phase locked to the stable reference signal of the VCXO 196. The output frequency of the VCXO 196 is phase locked to and corrected by the stable reference signal of the VCXO 145. The output frequency signal of the VCO 156 serves to correct the frequency error of the FM IF frequency signal applied to the VCO 170 in a manner hereinafter described. The programmable frequency divider circuit 162 provides a rapid synthesized reference signal in the output of the VCO 156 for correcting phase differences between the output frequency of the VCO 170 and the phase locked frequency reference signal produced in the output of the doubler circuit 167.

The output of the VCO 156 is applied to one input of a conventional mixer circuit 160 of the phase locked loop circuit 155c. The output of the VCO 170 is applied to the other input of the mixer circuit 160. The output frequency of the mixer circuit 160, in the exemplary embodiment, is 50 MHz-65 MHz, which is applied to one input of a conventional mixer circuit 200 of the phase locked loop circuit 155 through a conventional bandpass filter 160a. The phase locked loop circuit 155a is a fast responding loop (low noise) to provide a programmable synthesized reference signal so that the frequency of the VCO 170 can be converted down to a 5 MHz signal for the phase locked loop circuit 155c. The phase locked loop circuit 155c is phase locked to the output frequency of the doubler circuit 167 through the bandpass filter 167a and the amplifier 167b.

The output of the frequency divider network 154a is applied to one input of a phase detector circuit 166 of a phase locked loop circuit 155b. The output frequency of the frequency divider network 154a, in the exemplary embodiment, is 10 KHz. One output of a conventional voltage controlled oscillator (VCO) 201 of the phase locked loop circuit 155b is applied to a conventional frequency divider circuit 202 of the phase locked loop circuit 155b. The frequency divider circuit 202 is a programmable divider circuit. In the exemplary embodiment, the signal generated by the VCO 201 is in the frequency range of 55 MHz–70 MHz. The output signal of the frequency divider circuit 202 is applied to the other input of the phase detector circuit 166. The programmable frequency divider circuit 202 provides a rapid synthesized reference signal in the output of the VCO 201 for correcting phase differences between the output of the VCO 201 and the phase locked frequency reference signal produced in the output of the doubler circuit 167.

The output of the phase detector circuit 166 is applied to a conventional phase error amplifier 203 of the phase locked loop circuit 155b. The phase detector circuit 166 produces in the output thereof an error signal whose amplitude is proportional to differences in phase between the input signals applied to the input circuits of the phase detector circuit 166. The phase error signal produced in the output of the phase error amplifier 203 is applied to the VCO 201 to compensate for the phase error or phase difference in the output of the phase detector 166. When the phase difference of the signals applied to the input circuits of the phase detector 166 approaches or approximates zero, the VCO 201 is phase locked to the VCXO 145 through the frequency divider circuit 146 and the divider network 154a. The output of the mixer circuit 200 is applied to the other input circuit of the phase detector 168 through a conventional amplifier 200a of the phase locked loop circuit 155c. The VCO 170 is phase locked in a manner previously described to the output frequency of the doubler circuit 167 through the bandpass filter 167a and the amplifier 167b. The VCO 201 is phase locked to the stable output frequency of the VCXO 145, which, in turn, is phase locked to a reference signal derived from the FM IF signal applied to the descriminator 141.

The other output of the VCO 201 is applied to a conventional mixer circuit 200 of the phase locked loop circuit 155c. In the exemplary embodiment, the output of the mixer circuit 200 is 5 MHz, which is derived from the difference between the 50 MHZ–65 MHz output frequency of the VCO 156 and the 55 MHz–70 MHz output frequency of the VCO 201. The output of the VCO 170 produces the FM broadcast signal for transmission, which, in the exemplary embodiment, is in the range of 88 MHz–108 MHz.

The phase locked loop circuits 143 and 155 serve to maintain modulation and frequency integrity for the re-transmission station 20. The stations 15, 20 and 25 are synchronized to eliminate interference. Heterodyne and noise to the unsynchronized transmitters, phase shifts on the baseband, group delays and inconsistent modulation levels have been obviated to enhance broadcast program quality. A cleaner spectrum in the broadcast FM carrier is achieved by direct generation of the carrier from the VCO 170 instead of filtering out the FM broadcast carrier after heterodyne of two signals. The VCO 170 is operating at the desired output frequency at a high output level. Hence, additional amplification is not required for driving an additional power amplifier. The FM broadcast output signal from the power amplifier 172 is applied to the booster 85. The FM broadcast output signal of the booster 85 is applied to the re-transmitter 90 for broadcasting the FM signal that has originated from the broadcast studio 30.

A conventional automatic level control (ALC) circuit 175 is coupled to the output of the power amplifier 172 and applies a compensating control voltage to the power amplifier 172 to automatically maintain power output level applied to the booster 85. Included in the ALC circuit 175 is an adjustable variable resistor 176 for setting a reference voltage applied to the level control circuiting of power amplifier 172 in a well-known manner.

While reference herein may be made to standard FM broadcast frequency signals, it appears that the invention disclosed herein is also applicable to any FM radio frequency signals, including VHF, UHF and microwave signals, FM inter-city relay link signals, and any FM broadcast signals. It is also apparent that the synchronous FM exciters for the originating broadcast stations 15, 15', and 15'' need not employ all the operational features of the synchronous FM exciter 75, which were described in detail.

What is claimed is:

1. A synchronous frequency modulated booster for re-transmitting a frequency modulated broadcast signal comprising:
   A. transmitting means for re-transmitting a frequency modulated broadcast signal;
   B. receiving means for receiving a frequency modulated intermediate frequency signal; and
   C. a synchronous frequency modulated exciter receiving said frequency modulated intermediate frequency signal from said receiving means and applying to said transmitting means a frequency modulated broadcast signal for re-transmission by said transmitter means;
   D. said synchronous frequency modulated exciter comprising:
     (a) means responsive to said receiving means for producing a frequency reference signal representative of the frequency modulated intermediate frequency signal,
     (b) a first phase locked loop circuit responsive to said receiving means for producing a first stable phase locked frequency signal representative of the frequency modulated intermediate frequency signal,
     (c) a second phase locked loop circuit including a first voltage controlled oscillator, said first voltage controlled oscillator generating the frequency modulated broadcast signal, said first voltage controlled oscillator being phase locked to said frequency reference signal produced by said means, and
     (d) correcting phase locked loop circuit means responsive to the output of said first voltage controlled oscillator and responsive to said stable phase locked frequency produced by said first phase locked loop circuit and connected to said second phase locked loop circuit for correcting phase differences between the output of said first voltage controlled oscillator and said frequency reference signal produced by said means.

2. A synchronous frequency modulated booster for re-transmitting a frequency modulated broadcast signal comprising:
   A. transmitting means for re-transmitting a frequency modulated broadcast signal;
   B. receiving means for receiving a frequency modulated intermediate frequency signal; and
   C. a synchronous frequency modulated exciter receiving said frequency modulated intermediate frequency signal from said receiving means and applying to said transmitting means a frequency modulated broadcast signal for re-transmission by said transmitter means, D. said synchronous frequency modulated exciter comprising:
   (a) means responsive to said receiving means for producing a frequency reference signal representative of the frequency modulated intermediate frequency signal,
   (b) a first phase locked loop circuit responsive to said receiving means for producing a first stable phase locked frequency signal representative of the frequency modulated intermediate frequency signal,
   (c) a second phase locked loop circuit including a first voltage controlled oscillator, said first voltage controlled oscillator generating the frequency modulated broadcast signal, said first voltage controlled oscillator being phase locked to said frequency reference signal produced by said means, and
   (d) correcting phase locked loop circuit means responsive to the output of said first voltage controlled oscillator and responsive to said stable phase locked frequency produced by said first phase locked loop circuit and connected to said second phase locked loop circuit for correcting phase differences between the output of said first voltage controlled oscillator and said frequency reference signal produced by said means,
   (e) said second phase locked loop circuit including a first mixer circuit, one input of said first mixer circuit being connected to the output of said first voltage controlled oscillator, said correcting phase locked loop circuit means including a second voltage controlled oscillator, said second voltage controlled oscillator being connected to another input of said first mixer circuit producing a signal for correcting phase differences between the output of said first voltage controlled oscillator and said frequency reference signal produced by said means.

3. A synchronous frequency modulated booster as claimed in claim 2 wherein said correcting phase locked loop circuit means includes a third phase locked loop circuit, said third phase locked loop circuit includes said second voltage controlled oscillator and a first voltage controlled crystal oscillator, said first voltage controlled crystal oscillator producing a second stable frequency reference signal for phase locking said second voltage controlled oscillator, said first phase locked loop circuit includes a second voltage controlled crystal oscillator for producing said first stable phase locked frequency signal, said first voltage controlled crystal oscillator being phase locked to the first stable frequency reference signal produced by said second voltage controlled crystal oscillator.

4. A synchronous frequency modulated booster as claimed in claim 3 wherein said third phase locked loop circuit includes a programmable frequency divider circuit to provide a rapid synthesized reference signal in the output of said second voltage controlled oscillator for correcting phase differences between the output of said second voltage controlled oscillator and said phase locked frequency reference signal produced by said first voltage controlled crystal oscillator.

5. A synchronous frequency modulated booster as claimed in claim 4 wherein said second phase locked loop circuit includes a second mixer circuit and wherein said correcting phase locked loop circuit means includes a fourth phase locked loop circuit, the output of said first mixer circuit being connected to one input of said second mixer, said fourth phase locked loop circuit includes a third voltage controlled oscillator, said third voltage controlled oscillator being connected to another input of said second mixer circuit, said second mixer circuit in response to the output frequency signal of said first mixer circuit and in response to the output frequency of said third voltage controlled oscillator producing a frequency signal to correct phase differences between the output of said first voltage controlled oscillator and said frequency reference signal produced by said means.

6. A synchronous frequency modulated booster as claimed in claim 5 wherein said third voltage controlled oscillator is phase locked to said first stable phase locked frequency signal produced by said second voltage controlled crystal oscillator.

7. A synchronous frequency modulated booster as claimed in claim 5 wherein said fourth phase locked circuit includes a programmable frequency divider circuit to provide a rapid synthesized reference signal in the output of said third voltage controlled oscillator for correcting phase differences between the output of said third voltage controlled oscillator and said phase locked frequency reference signal produced by said first phase locked loop circuit.

8. A synchronous frequency modulated booster for re-transmitting a frequency modulated broadcast signal comprising:
   A. transmitting means for re-transmitting a frequency modulated broadcast signal;
   B. receiving means for receiving a frequency modulated intermediate frequency signal; and
   C. a synchronous frequency modulated exciter receiving said frequency modulated intermediate frequency signal from said receiving means and applying to said transmitting means a frequency modulated broadcast signal for re-transmission by said transmitter means,
   D. said synchronous frequency modulated exciter comprising:
      (a) first means responsive to said receiving means for producing a frequency reference signal representative of the frequency modulated intermediate frequency signal,
      (b) a phase locked loop circuit including a voltage controlled oscillator, said voltage controlled oscillator generating the frequency modulated broadcast signal, said voltage controlled oscillator being phase locked to said frequency reference signal produced by said first means, and
      (c) second means including a phase error correcting circuit connected to the output of said voltage controlled oscillator and said phase locked loop circuit and responsive to said receiving means for correcting phase differences between the output of said voltage controlled oscillator and said frequency reference signal produced by said first means.

9. A synchronous frequency modulated booster as claimed in claim 8 wherein said first means includes a doubler circuit responsive to said receiving means for producing said reference signal representative of the frequency modulated intermediate frequency signal.

10. A synchronous frequency modulated booster as claimed in claim 8 wherein said phase error correcting circuit produces a first stable phase locking frequency signal for correcting phase differences between the output of the voltage controlled oscillator and said frequency reference signal produced by said first means, and said second means produces a second stable phase locking frequency signal for phase locking said first stable phase locking frequency signal.

11. A synchronous frequency modulated booster as claimed in claim 10 wherein said second means includes a phase locked loop circuit for producing said second stable phase locking frequency signal, said last-mentioned phase locked loop circuit being responsive to said receiving means for producing a phase locked frequency reference signal representative of the frequency modulated intermediate frequency signal.

12. A synchronous frequency modulated booster as claimed in claim 8 wherein said phase error correcting circuit includes a programmable frequency divider circuit to provide a rapid synthesized reference signal for correcting phase differences between the output of the voltage controlled oscillator and the reference signal produced by said first means.

* * * * *